United States Patent
Sekine et al.

(10) Patent No.: US 8,389,968 B2
(45) Date of Patent: Mar. 5, 2013

(54) NONVOLATILE MEMORY DEVICE

(75) Inventors: Katsuyuki Sekine, Yokkaichi (JP); Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 216 days.

(21) Appl. No.: 12/795,197

(22) Filed: Jun. 7, 2010

(65) Prior Publication Data
US 2011/0068312 A1  Mar. 24, 2011

(30) Foreign Application Priority Data

Sep. 18, 2009 (JP) ................................ 2009-217441

(51) Int. Cl.
*H01L 29/02* (2006.01)

(52) U.S. Cl. .. 257/2; 257/3; 257/4; 257/5; 257/E29.002; 365/163; 438/102; 438/103; 438/104

(58) Field of Classification Search .................. 257/2–5, 257/E29.002; 438/102–104; 365/163
See application file for complete search history.

(56) References Cited

U.S. PATENT DOCUMENTS

| | | | |
|---|---|---|---|
| 2007/0114508 A1* | 5/2007 | Herner et al. | ...................... 257/2 |
| 2009/0046495 A1 | 2/2009 | Shimaoka et al. | |
| 2009/0134431 A1 | 5/2009 | Tabata et al. | |
| 2011/0193050 A1* | 8/2011 | Takano et al. | ...................... 257/4 |
| 2011/0216574 A1* | 9/2011 | Ichihara et al. | ............... 365/148 |
| 2012/0193600 A1* | 8/2012 | Himeno et al. | .................... 257/4 |

FOREIGN PATENT DOCUMENTS

| | | |
|---|---|---|
| JP | 2006-140489 | 6/2006 |
| JP | 2009-94344 | 4/2009 |

OTHER PUBLICATIONS

Korean Office Action issued Aug. 12, 2011, in Patent Application No. 10-2010-0084812 (with English-language translation).
U.S. Appl. No. 13/601,494, filed Aug. 31, 2012, Fukumizu, et al.

* cited by examiner

*Primary Examiner* — Jami M Valentine
(74) *Attorney, Agent, or Firm* — Oblon, Spivak, McClelland, Maier & Neustadt, L.L.P.

(57) ABSTRACT

According to one embodiment, a nonvolatile memory device comprises a plurality of first lines, a plurality of second lines, and memory cells. Each of the memory cells comprise a variable resistor, and a diode. The variable resistor includes a first metal oxide film and is configured to reversibly change resistance value by energy application. The diode includes a second metal oxide film and is connected in series to the variable resistor. The first metal oxide film has at least one of dielectric constant lower than that of the second metal oxide film and physical film thickness greater than that of the second metal oxide film.

20 Claims, 7 Drawing Sheets

NONVOLATILE MEMORY DEVICE

CROSS-REFERENCE TO RELATED APPLICATIONS

This application is based upon and claims the benefit of priority from the prior Japanese Patent Application No. 2009-217441, filed on Sep. 18, 2009, the entire contents of which are incorporated herein by reference.

BACKGROUND

1. Field

Embodiments described herein relate generally to a nonvolatile memory device utilizing a variable resistor.

2. Description of the Related Art

Conventionally, flash memory, in which memory cells having a floating gate structure are NAND-connected or NOR-connected to configure a memory cell array, is widely known as an electrically rewritable nonvolatile memory. In addition, ferroelectric memory is known as a nonvolatile memory capable of high-speed random access.

On the other hand, resistance varying memory using a variable resistor as the memory cell is proposed as a technology aiming for further miniaturization of memory cells. Known variable resistors include, for example, phase change memory elements in which change in the degree of crystallinity/amorphousness in a chalcogenide compound is used to change the resistance value, MRAM elements employing resistance change due to the tunnel magnetoresistive effect, memory elements for polymeric ferroelectric RAM (PFRAM) in which the resistance element is formed by a conductive polymer, and ReRAM elements in which electric pulse application is used to cause resistance change (US2009/0046495).

This resistance varying memory has its memory cells configurable by a series circuit of a diode and a variable resistor in place of a transistor, and therefore has the advantage that stacking is easy and adoption of a three-dimensional structure allows an even higher degree of integration to be achieved (JP 2009-94344 A).

In case of that a silicon-based diode is adopted for the diode, deposition and impurity activation temperatures rise. Accordingly, heat load leads to difficulties in multiple stacking of the memory-forming layers. In addition, difficulty of film thinning in the silicon-based diode results in a rise in aspect during processing of the memory-forming layers, which is a main cause of worsening yield.

In contrast, a MIIM diode is formed by stacking two or more kinds of insulating films having different band gaps and permittivities, whereby low temperature formation of the insulating film is possible and film thinning is easy.

However, conventional resistance varying memory requires a forming operation in which energy from outside is used to form a current path in the variable resistor in its initial state. This forming operation causes the insulating film used in the MIIM diode to deteriorate, leading to generation of read disturb and program disturb. That is, there is a problem that operation of the resistance varying memory is not stably performed.

DETAILED DESCRIPTION

According to one embodiment, a nonvolatile memory device comprises a plurality of first lines, a plurality of second lines, and memory cells. The plurality of second lines intersect the plurality of first lines. The memory cells connect between the first and second lines at intersection points the first and second lines. Each of the memory cells comprise a variable resistor, and a diode. The variable resistor includes a first metal oxide film and is configured to reversibly change resistance value by energy application. The diode includes a second metal oxide film and is connected in series to the variable resistor. The first metal oxide film has at least one of dielectric constant lower than that of the second metal oxide film and physical film thickness greater than that of the second metal oxide film.

According to one embodiment, a nonvolatile memory device comprises a plurality of first lines, a plurality of second lines, and memory cells. The plurality of second lines intersect the plurality of first lines. The memory cells connect between the first and second lines at intersection points the first and second lines. Each of the memory cells comprise a variable resistor, and a diode. The variable resistor includes a first metal oxide film and is configured to reversibly change resistance value by energy application. The diode includes a second metal oxide film and is connected in series to the variable resistor. Concentration of silicon or aluminum in the second metal oxide film is higher than concentration of silicon or aluminum in the first metal oxide film.

According to one embodiment, a nonvolatile memory device comprises a plurality of first lines, a plurality of second lines, and memory cells. The plurality of second lines intersect the plurality of first lines. The memory cells connect between the first and second lines at intersection points the first and second lines. Each of the memory cells comprise a variable resistor, and a diode. The variable resistor includes a first metal oxide film and is configured to reversibly change resistance value by energy application. The diode includes a second metal oxide film and is connected in series to the variable resistor. Metal/oxygen ratio of the second metal oxide film is lower than metal/oxygen ratio of the first metal oxide film.

Embodiments of a nonvolatile memory device in accordance with the present invention are described below with reference to the drawings.

[First Embodiment]

[Configuration]

Figure 1:
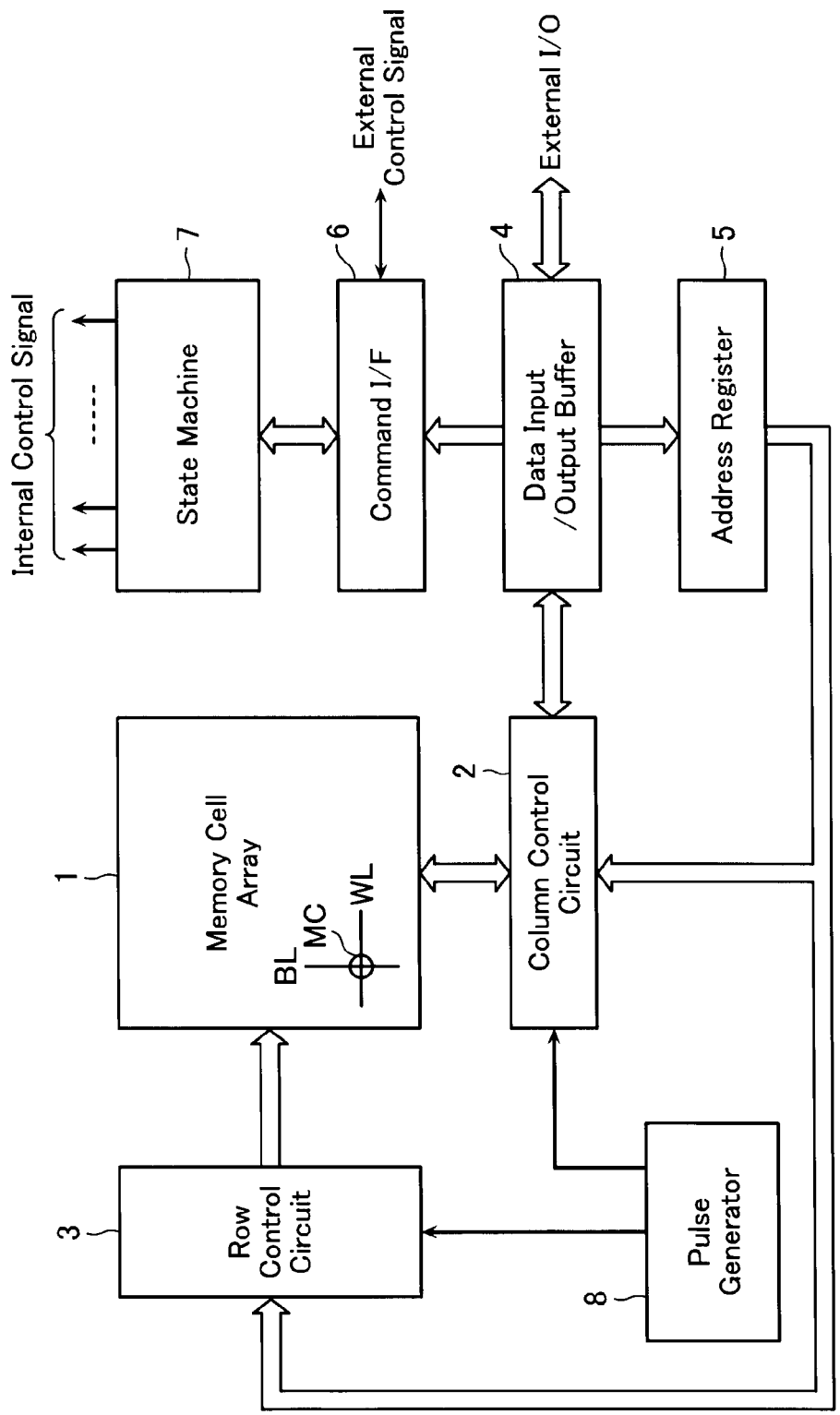
FIG. 1 is a block diagram of a nonvolatile memory device in accordance with a first embodiment.

First, an overall configuration of a nonvolatile memory device in accordance with a first embodiment is described with reference to FIG. 1. FIG. 1 is a block diagram of the nonvolatile memory device (nonvolatile memory) in accordance with the first embodiment.

The nonvolatile memory device in accordance with the first embodiment includes a memory cell array 1, a column control circuit 2, a row control circuit 3, a data I/O buffer 4, an address register 5, a command I/F 6, a state machine 7, and a pulse generator 8.

The memory cell array 1 includes a plurality of word lines (first lines) WL and a plurality of bit lines (second lines) BL, and memory cells MC provided at intersection points of the word lines WL and bit lines BL. Each of the memory cells MC is formed using a ReRAM (variable resistor) and a MIIM diode (non-ohmic element) to be described hereafter.

The column control circuit 2 controls the bit line BL in the memory cell array 1 to erase data in the memory cell, write data to the memory cell, and read data from the memory cell.

The row control circuit 3 selects the word line WL in the memory cell array 1 and applies voltages required to erase data in the memory cell, write data to the memory cell, and read data from the memory cell.

The data I/O buffer 4 is connected to an external host, not shown, via an I/O line to receive write data, receive erase instructions, provide read data, and receive address data and command data. The data I/O buffer 4 sends received write data to the column control circuit 2 and receives read-out data from the column control circuit 2 and provides it to external.

An address fed from external to the data I/O buffer 4 is sent via the address register 5 to the column control circuit 2 and the row control circuit 3.

A command fed from the host to the data I/O buffer 4 is received by the command interface 6. The command interface 6 receives an external control signal from the host and decides whether the data fed to the data I/O buffer 4 is write data, a command, or an address. If it is a command, then the command interface 6 transfers it as a received command signal to the state machine 7.

The state machine 7 manages the entire nonvolatile memory to receive commands from the host to execute read, write, erase, and execute data I/O management. The external host can also receive status information managed by the state machine 7 and decides the operation result. The status information is also utilized in control of write and erase.

The state machine 7 controls the pulse generator 8. Under this control, the pulse generator 8 is enabled to provide a pulse of any voltage at any timing. The pulse formed herein can be transferred to any line selected by the column control circuit 2 and the row control circuit 3. Note that peripheral circuit elements other than the memory cell array 1 can be formed in a Si substrate immediately beneath the memory cell array 1 formed in a wiring layer. Thus, the chip area of the nonvolatile memory can be made almost equal to the area of the memory cell array 1.

Figure 2:
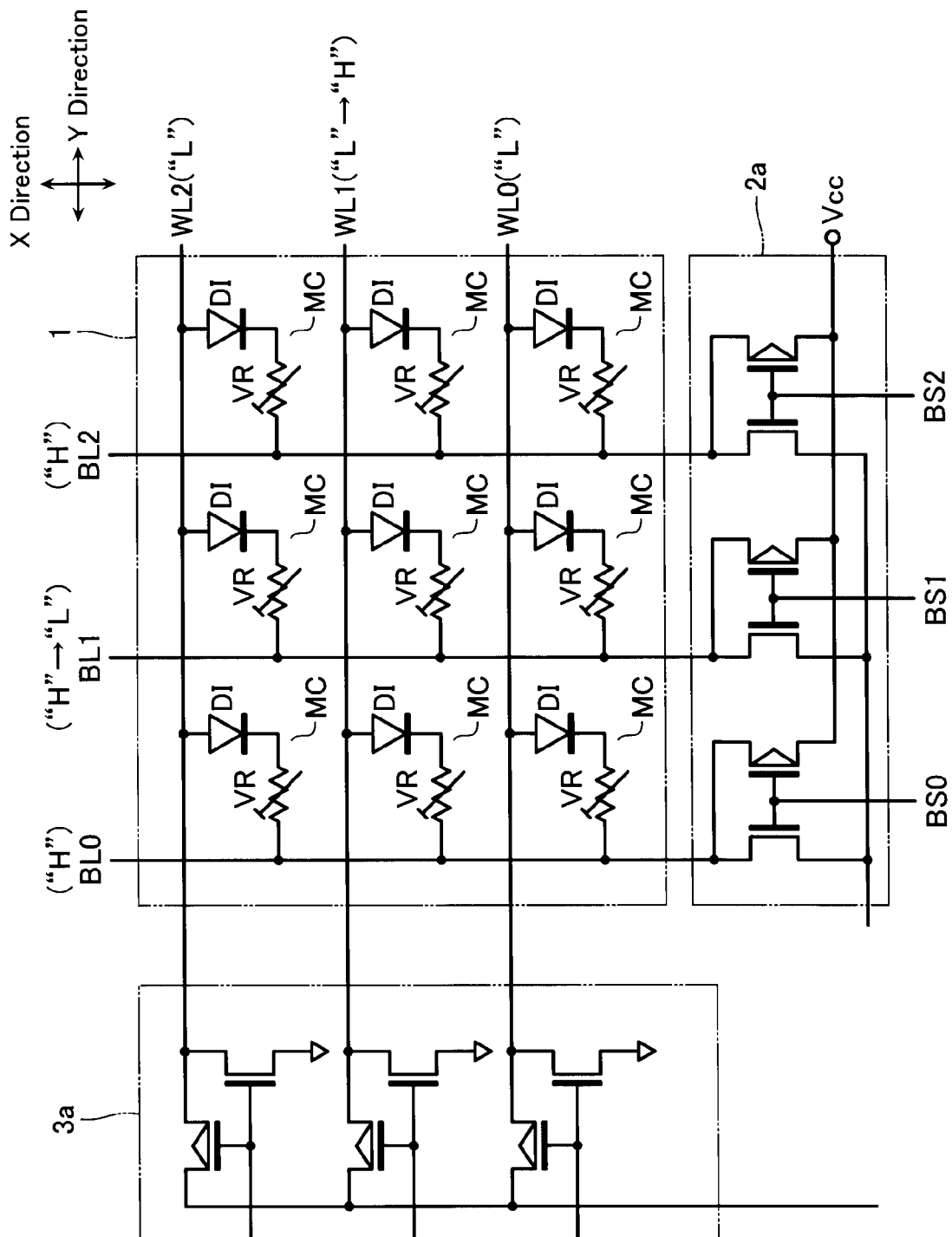
FIG. 2 is a circuit diagram of a memory cell array 1 and a peripheral circuit thereof.

Next, a circuit configuration of the nonvolatile memory device in accordance with the first embodiment is described with reference to FIG. 2. FIG. 2 is a circuit diagram of the memory cell array 1 and a peripheral circuit thereof.

As shown in FIG. 2, the nonvolatile memory device includes the memory cell array 1 mentioned above, a selection circuit 2a (part of the column control circuit 2), and a selection circuit 3a (part of the row control circuit 3).

One end of each of the word lines WL is connected to the selection circuit 3a. One end of each of the bit lines BL is connected to the selection circuit 2a. Each of the memory cells MC is configured by a MIIM diode (rectifier) DI and a variable resistor VR connected in series. The MIIM diode DI has its anode connected to the word line WL and its cathode connected to the bit line BL via the variable resistor VR. The variable resistor VR reversibly changes resistance value by energy application.

When memory cell MC in the second row and second column shown in FIG. 2 is subject to execution of various operations, word line WL1 is set to "H" from "L", and the other word lines WL0 and WL2 are held at "L". In addition, bit line BL1 is set to "L" from "H", and the other bit lines BL0 and BL2 are held at "H". Now, voltages applied to the memory cells MC are assumed to be a voltage $V_{set}$ during a write operation, a voltage $V_{reset}$ during an erase operation, and a voltage $V_{read}$ during a read operation, respectively. The magnitude relation of these voltages is $V_{read} < V_{reset} < V_{set}$.

Note that the above shows an example adapted to where memory cells are selected individually. However, in the case that data in a plurality of memory cells MC linked to the selected word line WL1 is read in one lot, a sense amplifier is disposed individually for each of the bit lines BL0-BL2, and each of the bit lines BL0-BL2 is individually connected by a bit line selection signal BS via the selection circuit 2a to the sense amplifier. Moreover, the memory cell array 1 may have the polarity of the MIIM diode DI set to the reverse of that shown in FIG. 2, so that current flows from the bit line BL side to the word line WL side.

Figure 3:
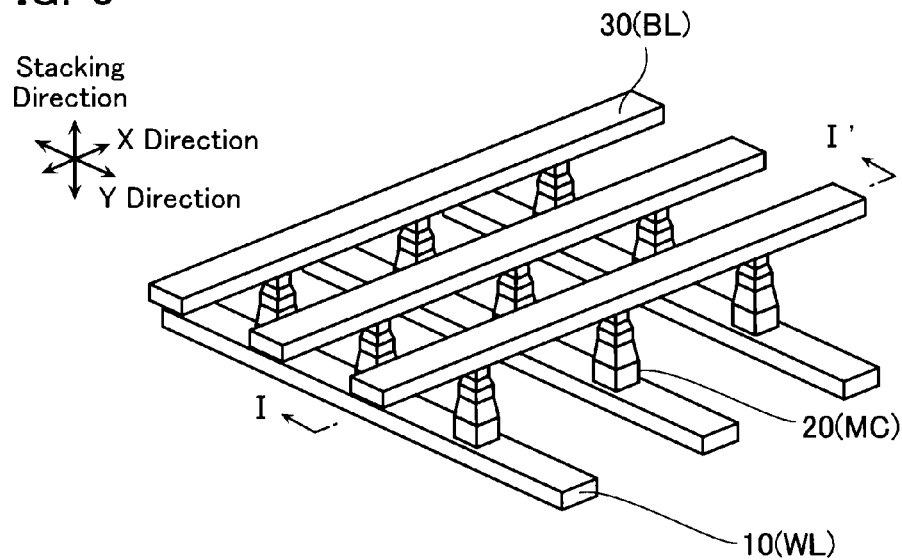
FIG. 3 is a perspective view of a part of the memory cell array 1.

Next, a stacking structure of the memory cell array 1 is described with reference to FIG. 3. FIG. 3 is a schematic perspective view showing the stacking structure of the memory cell array 1.

As shown in FIG. 3, the memory cell array 1 includes first wiring layers 10 functioning as the word lines WL (WL0-WL2), memory layers 20 functioning as the memory cells MC, and second wiring layers 30 functioning as the bit lines BL (BL0-BL2).

As shown in FIG. 3, the first wiring layers 10 are formed extending in a Y direction and having a certain pitch in an X direction. The first wiring layers 10 are preferably composed of a material with good heat resistance and a low resistance value, for example, tungsten (W), tungsten silicide (WSi), nickel silicide (NiSi), cobalt silicide (CoSi), or the like.

As shown in FIG. 3, the memory layers 20 are formed in a column shape on upper surfaces of the first wiring layers 10. The memory layers 20 are formed in a matrix having a certain pitch in the X direction and the Y direction.

As shown in FIG. 3, the second wiring layers 30 are formed in contact with upper surfaces of the memory layers 20 arranged in a line in the X direction. The second wiring layers 30 are formed extending in the X direction and having a certain pitch in the Y direction. The second wiring layers 30 are preferably composed of a material with good heat resistance and a low resistance value, for example, tungsten (W), tungsten silicide (WSi), nickel silicide (NiSi), cobalt silicide (CoSi), or the like.

Figure 4:
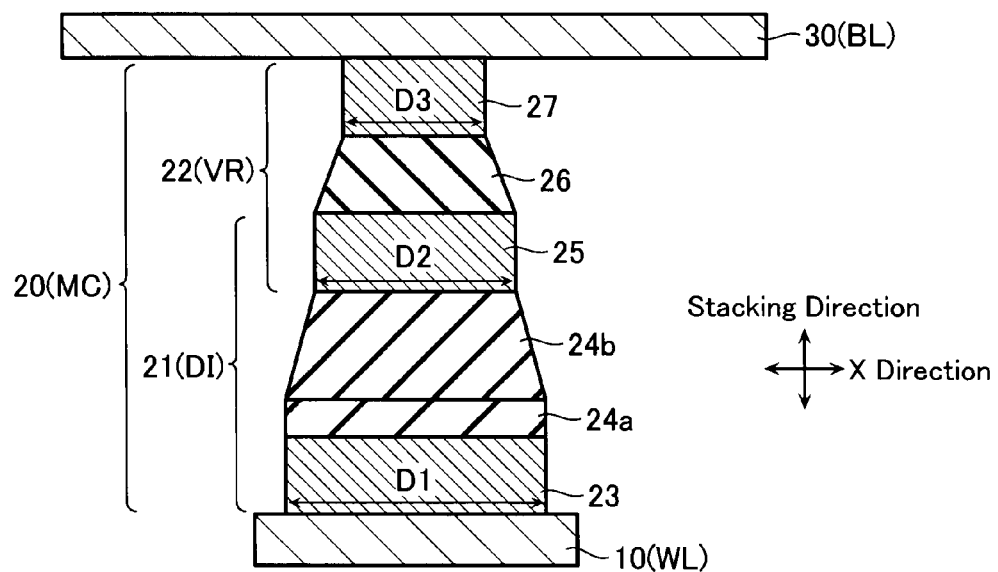
FIG. 4 is a cross-sectional view of one memory cell taken along the line I-I' and seen from the direction of the arrow in FIG. 3.

Next, a detailed stacking structure of the memory layer 20 is described. FIG. 4 is a cross-sectional view taken along the line I-I' in FIG. 3.

As shown in FIG. 4, the memory layer 20 includes a rectifier layer 21 configured by the MIIM diode DI, and a variable resistance layer 22 functioning as the variable resistor VR. The cross-sectional area of the XY plane of the rectifier layer 21 is configured to be greater than the cross-sectional area of the XY plane of the variable resistance layer 22.

As shown in FIG. 4, the rectifier layer 21 includes an electrode film 23, an insulating film 24a, a metal oxide film 24b, and an electrode film 25, stacked sequentially on the first wiring layer 10. The electrode film 23 is formed extending directly upwards, and has a lower surface and upper surface of cross-sectional area D1. Likewise, the insulating film 24a is formed extending directly upwards, and has a lower surface and upper surface of cross-sectional area D1. The metal oxide film 24b is formed in a tapered shape, and has a lower surface of cross-sectional area D1 and an upper surface of cross-sectional area D2 (D2<D1). The electrode film 25 is formed extending directly upwards, and has a lower surface and upper surface of cross-sectional area D2.

The electrode film 23 and the electrode film 25 are composed of an oxidation-resistant material since they are in contact with an oxide film. For example, the electrode film 23 and the electrode film 25 are composed of titanium nitride, tantalum nitride or a material having aluminum or silicon added to the titanium nitride and tantalum nitride, or are composed of platinum, gold, or an oxide conductor such as ruthenium oxide.

The insulating film 24a is composed of a material having a relative dielectric constant of 10 or less, and the metal oxide film 24b is composed of a material having a relative dielectric constant of 10 or more. For example, the insulating film 24a is composed of a silicon oxide film, a silicon nitride film, a silicon oxynitride film, or alumina. The metal oxide film 24b is composed of a transition metal oxide film (for example, hafnia, zirconia, titania, tantalum oxide, or the like).

As shown in FIG. 4, the variable resistance layer 22 is configured by the electrode film 25, a metal oxide film 26, and an electrode film 27, which are stacked. That is, the variable resistance layer 22 shares the electrode film 25 with the rectifier layer 21.

The metal oxide film 26 is formed in a tapered shape, and has a lower surface of cross-sectional area D2 and an upper surface of cross-sectional area D3 (D3<D2). The electrode film 27 is formed extending directly upwards, and has a lower surface and upper surface of cross-sectional area D3.

The metal oxide film 26 is configured to change its resistance value due to an applied voltage. Permittivity of the metal oxide film 26 is lower than dielectric constant of the metal oxide film 24b. Moreover, physical film thickness of the metal oxide film 26 is greater than physical film thickness of the metal oxide film 24b. The metal oxide film 26 is composed of a transition metal oxide film (for example, hafnia, zirconia, titania, tantalum oxide, or the like), in view of compatibility with the CMOS process. Note that the electrode film 27 is composed of a similar material to the electrode films 23 and 25.

[Method of Manufacturing]

Next, a method of manufacturing the nonvolatile memory device in accordance with the first embodiment is described with reference to FIGS. 5-8. FIGS. 5-8 are cross-sectional views showing manufacturing processes of the nonvolatile memory device in accordance with the first embodiment.

Figure 5:
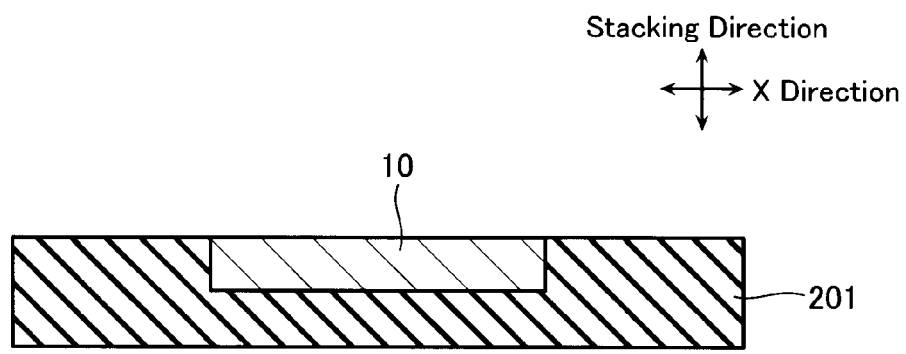
FIG. 5 is a cross-sectional view showing a manufacturing process of the nonvolatile memory device in accordance with the first embodiment.

First, processes are employed for creating CMOS on a semiconductor substrate not shown, thereby forming the peripheral circuit of the memory cell array 1 (not shown). Next, PECVD (Plasma Enhanced Chemical Vapor Deposition) is employed on the above-mentioned semiconductor substrate to form an interlayer insulating layer 201 comprising a silicon oxide film. Then, as shown in FIG. 5, a damascene process is employed to form the first wiring layer 10 comprising tungsten in the interlayer insulating layer 201. Here, formation of the first wiring layer 10 may be performed using PVD (Physical Vapor Deposition) or CVD (Chemical Vapor Deposition). When a damascene process is employed, it is preferably performed using CVD, since CVD is superior to PVD in terms of coverage.

Figure 6:
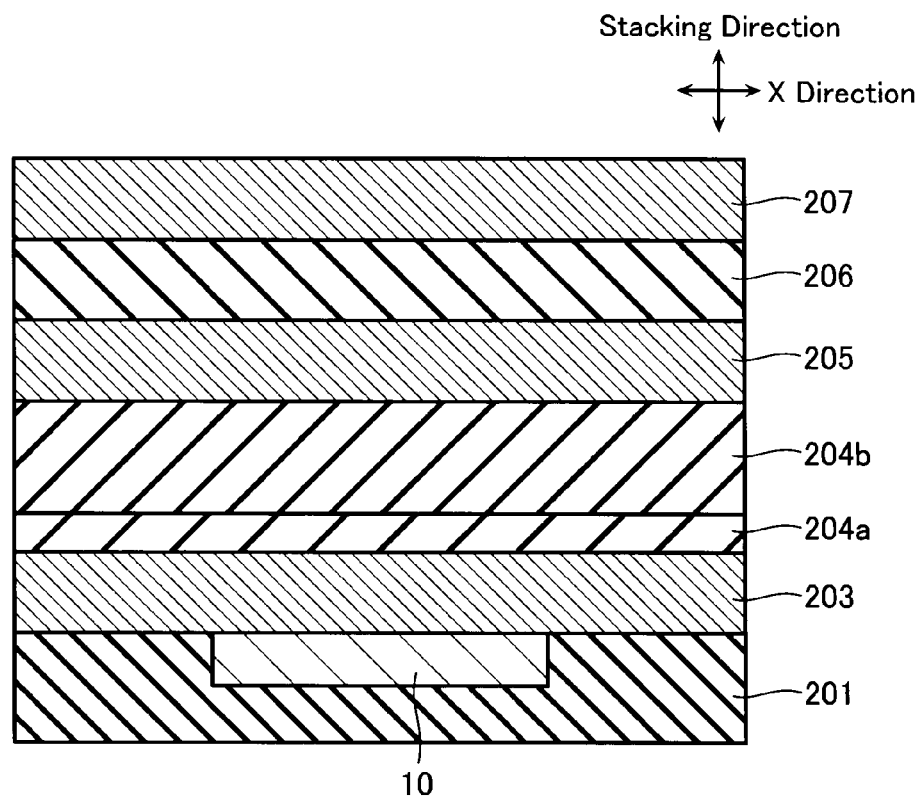
FIG. 6 is a cross-sectional view showing a manufacturing process of the nonvolatile memory device in accordance with the first embodiment.

Next, as shown in FIG. 6, films 203, 204a, 204b, and 205-207 are formed sequentially on the first wiring layer 10 using PVD or ALD (Atomic Layer Deposition).

The film 203 is formed by depositing an oxidation-resistant material (titanium nitride, tantalum nitride, or the like) with a thickness of, for example, 5-20 nm.

The film 204a is formed by depositing a silicon oxide film, a silicon nitride film, or silicon oxynitride film with a thickness of, for example, 0.5-2 nm. Here, the silicon oxynitride film may be formed by first using ALD or PVD to form a silicon oxide film, and then employing radical nitridization to introduce nitrogen to the silicon oxide film. Furthermore, if, subsequent to formation of the film 204a, it undergoes improving annealing at 300-700° C. in an inert gas, or nitrogen gas, or an atmosphere of these gases including an amount of oxygen that is small enough not to oxidize the film 203, reverse leak current in the MIIM diode DI can be reduced.

The film 204b is formed by depositing a transition metal oxide film (hafnia, zirconia, titania, tantalum oxide, or the like) with a thickness of, for example, 1-5 nm. Furthermore, if, subsequent to formation of the film 204b, it undergoes improving annealing at 300-700° C. in an inert gas, or nitrogen gas, or an atmosphere of these gases including an amount of oxygen that is small enough not to oxidize the film 203, reverse leak current in the MIIM diode DI can be reduced.

The film 205 is formed by depositing an oxidation-resistant material (titanium nitride, tantalum nitride, or the like) with a thickness of, for example, 5-20 nm.

The film 206 is formed by depositing a transition metal oxide film (hafnia, zirconia, titania, tantalum oxide, or the like) with a thickness of, for example, 5-20 nm. The film 206 may be formed by first using PVD to deposit a transition metal film, and then thermally oxidizing the transition metal film in an oxidizing atmosphere at a low temperature of 400-600° C. (first method). Alternatively, the film 206 may be formed by first using PVD to deposit a transition metal film, and then exposing the transition metal film to an atmosphere including oxygen radicals at from room temperature to about 600° C. (second method). Here, the second method is preferable, since the forming voltage for the metal oxide film 26 is lower with the second method than when the film 206 is deposited directly using ALD or PVD.

The film 207 is formed by depositing an oxidation-resistant material (titanium nitride, tantalum nitride, or the like) with a thickness of, for example, 5-20 nm.

Figure 7:
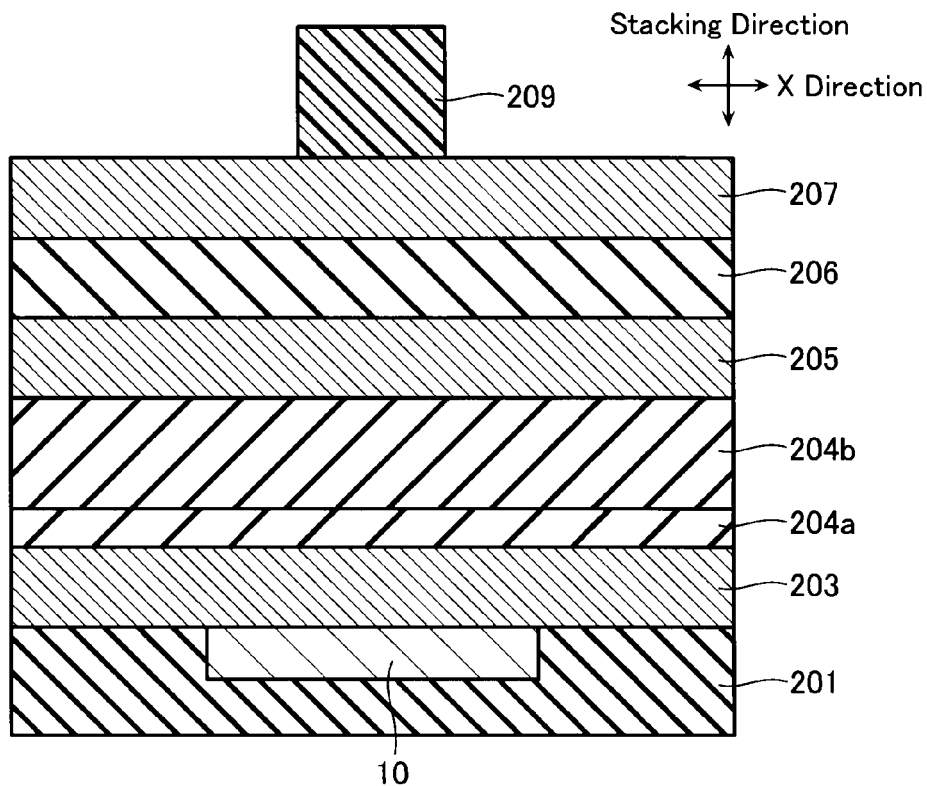
FIG. 7 is a cross-sectional view showing a manufacturing process of the nonvolatile memory device in accordance with the first embodiment.

Next, as shown in FIG. 7, resist is applied on the film 207 and photolithography technology employed to pattern the resist, thereby forming a mask 209.

Figure 8:
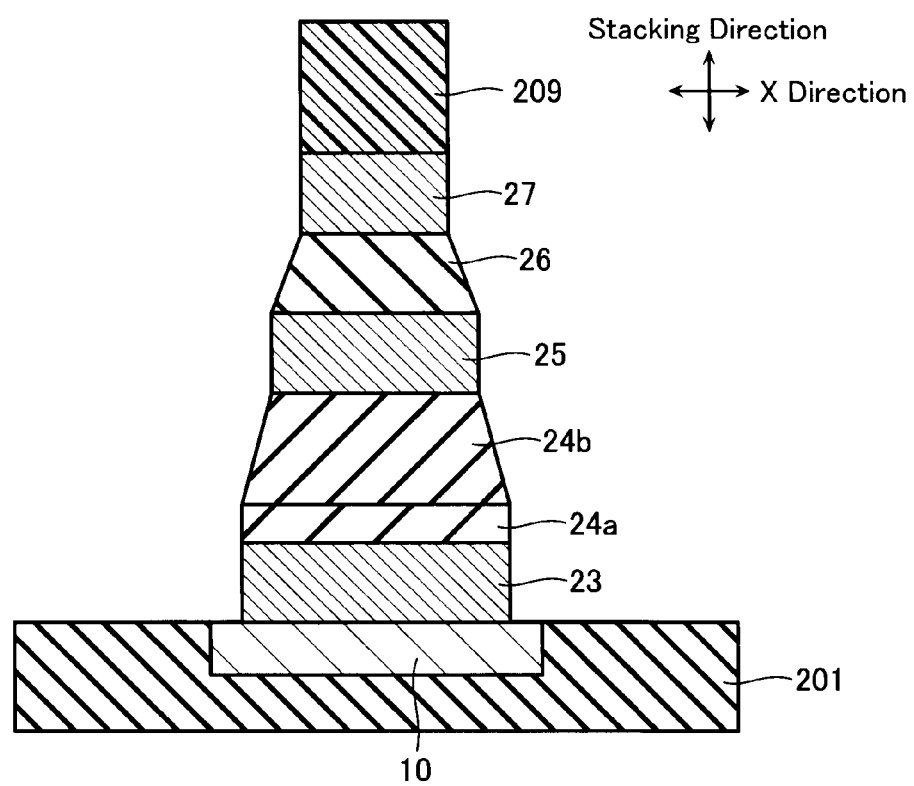
FIG. 8 is a cross-sectional view showing a manufacturing process of the nonvolatile memory device in accordance with the first embodiment.

Next, as shown in FIG. 8, RIE (Reactive Ion Etching) using the mask 209 is utilized to perform etching in one lot from the film 207 to the film 203. Through this process, the film 203 becomes the electrode film 23; the film 204a becomes the insulating film 24a; the film 204b becomes the metal oxide film 24b; the film 205 becomes the electrode film 25; the film 206 becomes the metal oxide film 26; and the film 207 becomes the electrode film 27.

In the process shown in FIG. 8, the etching is performed under conditions that intentionally lead to formation of a taper from the film 207 to the film 203. For example, the etching is performed at a temperature which is about 50-100° C. lower than normal. Alternatively, the overetching amount is set to be less than normal. As described above, the processes shown in FIGS. 5-8 are used to form the first wiring layer 10 and the memory layer 20.

Subsequent to FIG. 8, PECVD or coating is used to form an insulating film to a layer above the electrode film 27. Then, CMP is used to planarize the insulating film to an upper surface of the electrode film 27. Then, subsequent to formation of an interlayer insulating layer using PECVD or coating, a damascene process is employed to form the second wiring layer 30.

[Advantages]

Next, advantages of the nonvolatile memory device in accordance with the first embodiment are described. In the first embodiment, dielectric constant of the metal oxide film 26 is lower than dielectric constant of the metal oxide film 24b. Moreover, physical film thickness of the metal oxide film 26 is greater than physical film thickness of the metal oxide film 24b. These configurations cause the voltage applied across the rectifier layer 21 (metal oxide film 24b) to be less than the voltage applied across the variable resistance layer 22 (metal oxide film 26). It is therefore possible to suppress deterioration in the insulating film 24a and the metal oxide film 24b configuring the MIIM diode DI caused by the forming operation. That is, the first embodiment forms a configuration that is strong in terms of data retention characteristics, program disturb and read disturb.

In addition, in the first embodiment, area of the electrode film 23 is greater than area of the electrode film 25, and area of the electrode film 25 is greater than area of the electrode film 27. This configuration results in the first embodiment having the voltage applied across the rectifier layer 21 (metal oxide film 24b) being less than the voltage applied across the variable resistance layer 22 (metal oxide film 26), and, furthermore, results in the first embodiment forming a configuration that is strong in terms of data retention characteristics, program disturb and read disturb, similarly to the above-described advantages.

Moreover, in the first embodiment, the insulating film 24a is composed of a material having a relative dielectric constant of 10 or less, and the metal oxide film 24b is composed of a material having a relative dielectric constant of 10 or more. This configuration causes a difference in dielectric constant and a difference in band gap to occur between the insulating film 24a and the metal oxide film 24b in the first embodiment, thereby enabling forward current to be secured while reverse leak current is reduced in the MIIM diode DI.

[Second Embodiment]
[Configuration]

Figure 9:
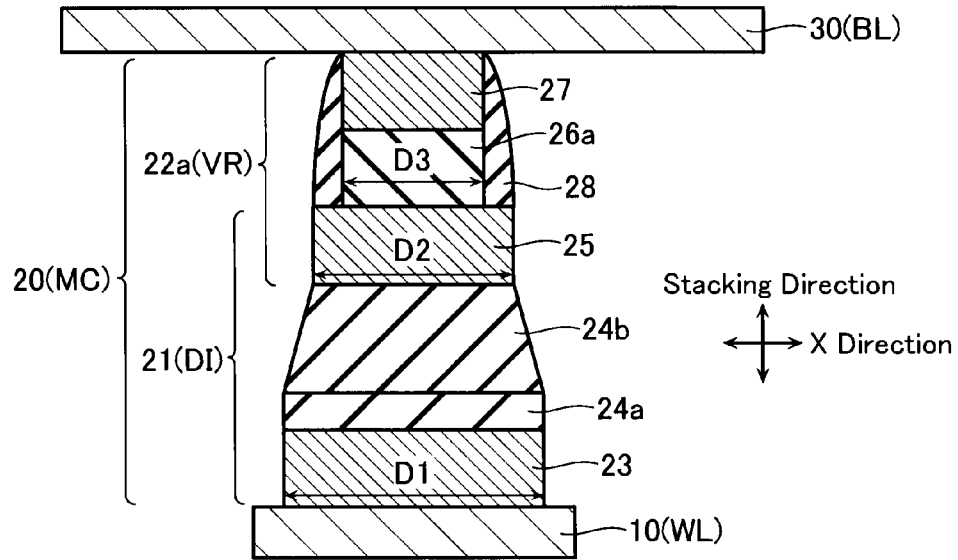
FIG. 9 is a cross-sectional view of one memory cell in a nonvolatile memory device in accordance with a second embodiment.

Next, a stacking configuration of a memory layer 20 in accordance with a second embodiment is described with reference to FIG. 9. FIG. 9 is a cross-sectional view of the memory layer 20 in accordance with the second embodiment. Note that in the second embodiment, identical symbols are assigned to configurations similar to those in the first embodiment and descriptions thereof are omitted.

As shown in FIG. 9, the memory layer 20 includes a variable resistance layer 22a having a different shape to that of the first embodiment. The variable resistance layer 22a includes a metal oxide film 26a in place of the metal oxide film 26 of the first embodiment, and further includes a side wall film 28.

The metal oxide film 26a is composed of a similar material to the first embodiment, and differs from the first embodiment only in its shape. The metal oxide film 26a is formed extending directly upwards, and has a lower surface and upper surface of cross-sectional area D3.

The side wall film 28 is formed on an upper surface of the electrode film 25. The side wall film 28 is formed surrounding a side surface of the metal oxide film 26a and a side surface of the electrode film 27. The side wall film 28 is configured by a silicon oxide film or a silicon nitride film.

[Method of Manufacturing]

Figure 10:
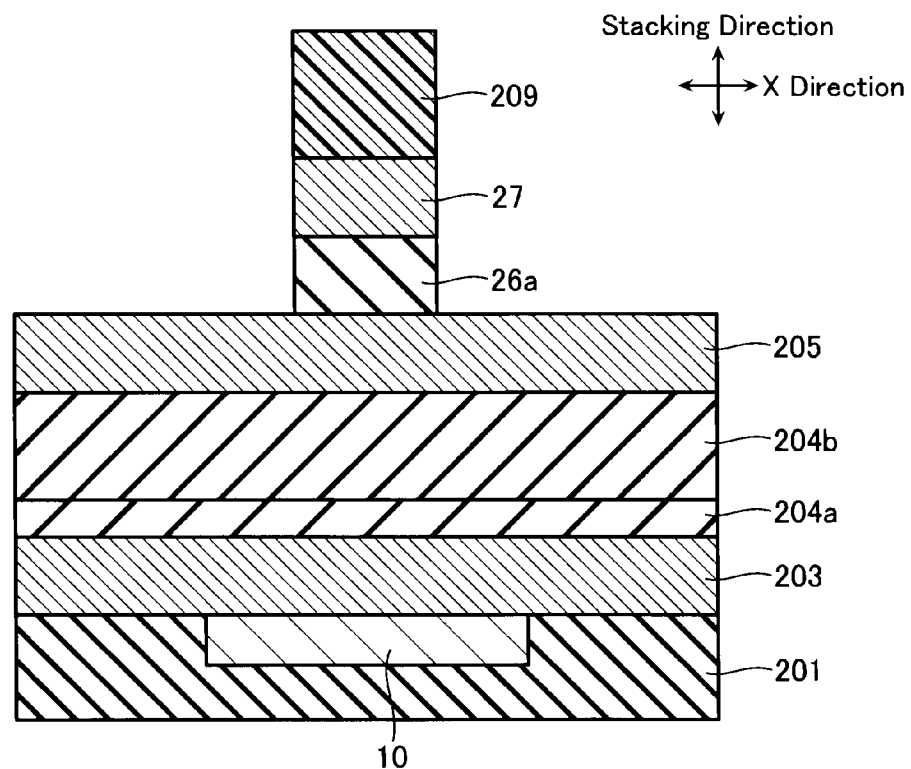
FIG. 10 is a cross-sectional view showing a manufacturing process of the nonvolatile memory device in accordance with the second embodiment.

Next, a method of manufacturing a nonvolatile memory device in accordance with the second embodiment is described with reference to FIGS. 10-12.

First, processes shown in FIGS. 5-7 of the first embodiment are executed. In the second embodiment, subsequent to FIG. 7, etching is stopped on reaching the upper surface of the film 205, as shown in FIG. 10. Through this process, the film 206 becomes the metal oxide film 26a; and the film 207 becomes the electrode film 27.

Figure 11:
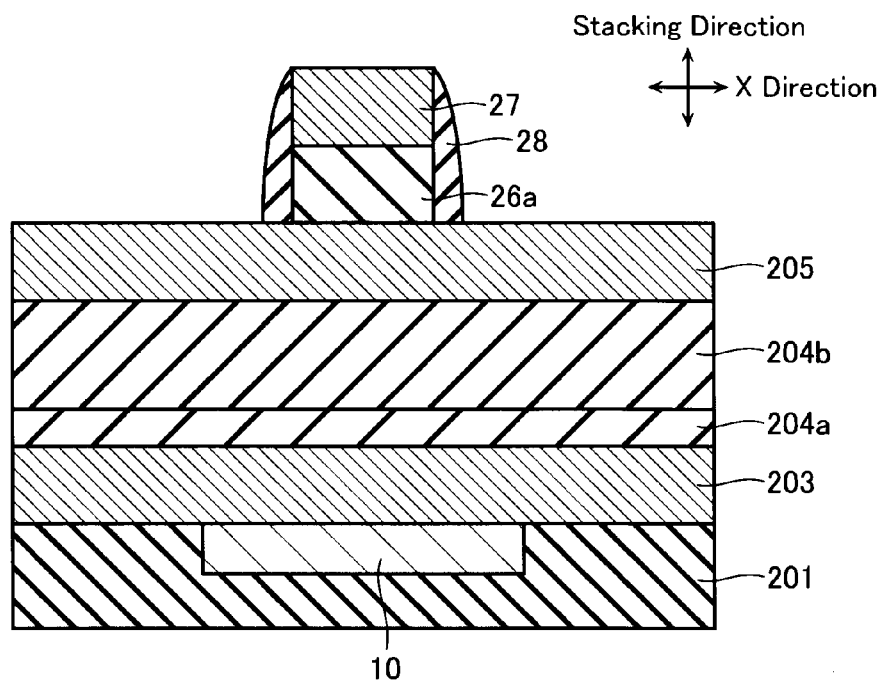
FIG. 11 is a cross-sectional view showing a manufacturing process of the nonvolatile memory device in accordance with the second embodiment.

Next, as shown in FIG. 11, the mask 209 is stripped, and the side wall film 28 is formed on the side wall of the metal oxide film 26a and the side wall of the electrode film 27. The side wall film 28 is formed by first using ALD or PECVD to deposit a silicon oxide film or silicon nitride film and then etching the silicon oxide film or silicon nitride film.

Figure 12:
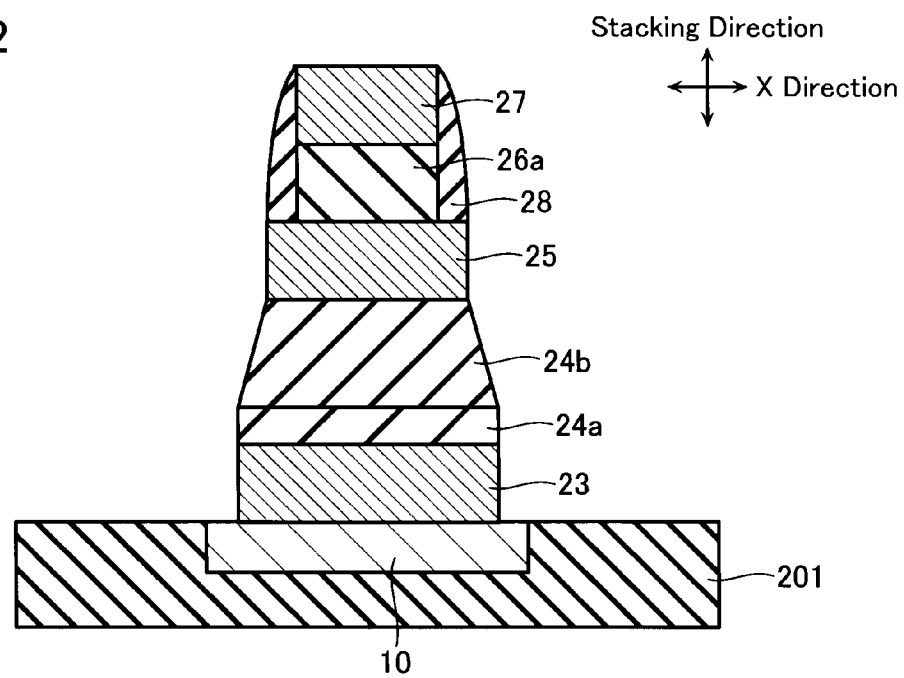
FIG. 12 is a cross-sectional view showing a manufacturing process of the nonvolatile memory device in accordance with the second embodiment.

Subsequently, as shown in FIG. 12, etching is performed in one lot from the film 205 to the film 203 using the side wall film 28 as a mask. Through this process, the film 203 becomes the electrode film 23; the film 204a becomes the insulating film 24a; the film 204b becomes the metal oxide film 24b; and the film 205 becomes the electrode film 25. In the process shown in FIG. 12, the etching is performed under conditions that intentionally lead to formation of a taper from the film 205 to the film 203.

[Advantages]

Next, advantages of the nonvolatile memory device in accordance with the second embodiment are described. In the second embodiment, the lower surface and upper surface of the metal oxide film 26a differ from those of the first embodiment in having a cross-sectional area D3. This allows the second embodiment to achieve a higher current density flowing in the variable resistance layer 22 than the first embodiment.

[Third Embodiment]
[Configuration]

Next, a stacking configuration of a nonvolatile memory device in accordance with a third embodiment is described. Note that in the third embodiment, identical symbols are assigned to configurations similar to those in the first and second embodiments and descriptions thereof are omitted.

The nonvolatile memory device in accordance with the third embodiment has a configuration substantially similar to that of FIG. 4 in the first embodiment. However, in the third embodiment, the material composing the metal oxide film 24b and the metal oxide film 26 is different to that of the first embodiment.

The metal oxide film 24b and the metal oxide film 26 are composed of a transition metal oxide film (for example, hafnia, zirconia, titania, tantalum oxide, or the like), similarly to the first embodiment. On the other hand, concentration of silicon or aluminum in the metal oxide film 24b is higher than concentration of silicon or aluminum in the metal oxide film 26 and in this point the third embodiment differs from the first embodiment.

[Method of Manufacturing]

Next, a method of manufacturing the nonvolatile memory device in accordance with the third embodiment is described. The method of manufacturing in the third embodiment is substantially similar to the processes shown in FIGS. 5-8 of the first embodiment. However, the process for depositing the film 204b and the film 206 shown in FIG. 6 differs from the first embodiment.

The process for depositing the film 204b and the film 206 in the third embodiment is executed by any one of the first through fourth methods of manufacturing shown below.

In the first method of manufacturing, PVD is performed with silicon or aluminum included in the target. In the second method of manufacturing, cosputtering of the silicon or aluminum (alternatively, silicon oxide or alumina) target along with a transition metal oxide is performed.

In the third method of manufacturing, ALD is performed with a silicon source of dichlorosilane, disilane, TDMAS (trisdimethylaminosilane), or the like, supplied. In the fourth method of manufacturing, PVD and ALD are used to deposit a transition metal oxide film and silicon oxide film, or alumina, after which heat treatment is performed to mix the material composing the films.

[Advantages]

Next, advantages of the nonvolatile memory device in accordance with the third embodiment are described. In the third embodiment, concentration of silicon or aluminum in the metal oxide film 24b is higher than concentration of silicon or aluminum in the metal oxide film 26. This results in an increase in dielectric strength voltage of the metal oxide film 24b. In addition, the metal oxide film 24b and the metal oxide film 26 are composed of hafnia, zirconia, titania, tantalum oxide, or the like, and these materials result in a large increase in the above-described dielectric strength voltage. It is therefore possible in the third embodiment to suppress deterioration in the metal oxide film 24b configuring the MIIM diode DI during the forming operation. That is, reverse leak current in the MIIM diode DI subsequent to the forming operation can be kept low, and the third embodiment forms a configuration that is strong in terms of data retention characteristics, program disturb and read disturb.

[Fourth Embodiment]
[Configuration]

Next, a stacking configuration of a nonvolatile memory device in accordance with a fourth embodiment is described. Note that in the fourth embodiment, identical symbols are assigned to configurations similar to those in the first through third embodiments and descriptions thereof are omitted.

The nonvolatile memory device in accordance with the fourth embodiment has a configuration substantially similar to that of FIG. 4 in the first embodiment. However, in the fourth embodiment, the material composing the metal oxide film 24b and the metal oxide film 26 is different to that of the first embodiment.

The metal oxide film 24b and the metal oxide film 26 are composed of a transition metal oxide film (for example, hafnia, zirconia, titania, tantalum oxide, or the like), similarly to the first embodiment. On the other hand, metal/oxygen ratio of the metal oxide film 24b is lower than metal/oxygen ratio of the metal oxide film 26 and in this point the fourth embodiment differs from the first embodiment. Specifically, the metal oxide film 24b has a near-stoichiometric metal/oxygen ratio, and the metal oxide film 26 has an metal/oxygen ratio including a stoichiometry-exceeding surplus of metal.

[Method of Manufacturing]

Next, a method of manufacturing the nonvolatile memory device in accordance with the fourth embodiment is described. The method of manufacturing in the fourth embodiment is substantially similar to the processes shown in FIGS. 5-8 of the first embodiment. However, the process for depositing the film 204b and the film 206 shown in FIG. 6 differs from the first embodiment.

The process for depositing the film 204b and the film 206 in the fourth embodiment is executed by any one of the first through fifth methods of manufacturing shown below.

In the first method of manufacturing, PVD is performed using a target having a metal-rich composition. In the second method of manufacturing, cosputtering of a metal target along with an insulator target is performed.

In the third method of manufacturing, PVD is used to deposit a metal film and then thermal oxidation at 300-600° C. or radical oxidation is performed. In the fourth method of manufacturing, ALD is performed at a temperature higher than that at which a stoichiometric film is formed, either increasing the adsorbed amount of metal source, or reducing to extreme the supplied amount of oxidizing agent.

In the fifth method of manufacturing, ALD is used to form a stoichiometric metal oxide film, and then a metal thin film is formed. Subsequently, heat treatment of 200-500° C. is performed in an inert gas atmosphere or a trace oxygen supplemented atmosphere.

[Advantages]

Next, advantages of the nonvolatile memory device in accordance with the fourth embodiment are described. In the fourth embodiment, metal/oxygen ratio of the metal oxide film 24b is lower than metal/oxygen ratio of the metal oxide film 26. As a result, in the fourth embodiment, forming of the metal oxide film 26 is possible at a lower voltage than in the first through third embodiments. It is therefore possible in the fourth embodiment to suppress deterioration in the metal oxide film 24b configuring the MIIM diode DI during the forming operation. That is, the fourth embodiment forms a configuration that is strong in terms of data retention characteristics, program disturb and read disturb.

[Other Embodiments]

While certain embodiments have been described, these embodiments have been presented byway of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

For example, in the first embodiment, dielectric constant of the metal oxide film 26 is lower than dielectric constant of the metal oxide film 24b (first state) and physical film thickness of the metal oxide film 26 is greater than physical film thickness of the metal oxide film 24b (second state). However, the metal oxide film 26 and the metal oxide film 24b need only be configured such that at least one of the above-described first state and second state is attained.

In addition, the third and fourth embodiments may be configured to include the side wall film 28 as in the second embodiment.

What is claimed is:

1. A nonvolatile memory device, comprising:
a plurality of first lines;
a plurality of second lines intersecting the plurality of first lines; and
memory cells connected between the first and second lines at intersection points of the first and second lines,
each of the memory cells comprising:
a variable resistor including a first metal oxide film and configured to reversibly change resistance value by energy application; and a diode including a second metal oxide film and connected in series to the variable resistor, the first metal oxide film having a physical film thickness greater than that of the second metal oxide film.

2. The nonvolatile memory device according to claim 1, wherein the diode is connected to one of the first lines via a first electrode and is connected to the variable resistor via a second electrode, the variable resistor is connected to one of the second lines via a third electrode, and an area of the first electrode is greater than area of the third electrode.

3. The nonvolatile memory device according to claim 2, wherein an area of the second electrode is less than the area of the first electrode and greater than an area of the third electrode.

4. The nonvolatile memory device according to claim 1, wherein the first metal oxide film includes a first surface positioned on a side of the second metal oxide film and a second surface positioned on an opposite side to the second metal oxide film, and an area of the first surface is greater than an area of the second surface.

5. The nonvolatile memory device according to claim 1, wherein the first metal oxide film includes a first surface positioned on a side of the second metal oxide film and a second surface positioned on an opposite side to the second metal oxide film, and an area of the first surface is substantially equal to an area of the second surface.

6. The nonvolatile memory device according to claim 1, wherein the second metal oxide film includes a first surface positioned on a side of the first metal oxide film and a second surface positioned on an opposite side to the first metal oxide film, and an area of the second surface is greater than an area of the first surface.

7. The nonvolatile memory device according to claim 1, wherein the diode further includes an insulating film in contact with the second metal oxide film, the insulating film is composed of a material having a relative dielectric constant of 10 or less, and the second metal oxide film is composed of a material having a relative dielectric constant of 10 or more.

8. The nonvolatile memory device according to claim 5, wherein the variable resistor further comprises a side wall film surrounding a side surface of the first metal oxide film.

9. A nonvolatile memory device, comprising:

a plurality of first lines;

a plurality of second lines intersecting the plurality of first lines; and memory cells connected between the first and second lines at intersection points of the first and second lines, each of the memory cells comprising:

a variable resistor including a first metal oxide film and configured to reversibly change resistance value by energy application; and a diode including a second metal oxide film and connected in series to the variable resistor, a concentration of silicon or aluminum in the second metal oxide film being higher than a concentration of silicon or aluminum in the first metal oxide film.

10. The nonvolatile memory device according to claim 9, wherein the diode is connected to one of the first lines via a first electrode and is connected to the variable resistor via a second electrode, the variable resistor is connected to one of the second lines via a third electrode, and an area of the first electrode is greater than an area of the third electrode.

11. The nonvolatile memory device according to claim 10, wherein an area of the second electrode is less than an area of the first electrode and greater than area of the third electrode.

12. The nonvolatile memory device according to claim 9, wherein the first metal oxide film includes a first surface positioned on a side of the second metal oxide film and a second surface positioned on an opposite side to the second metal oxide film, and an area of the first surface is greater than an area of the second surface.

13. The nonvolatile memory device according to claim 9, wherein the first metal oxide film includes a first surface positioned on a side of the second metal oxide film and a second surface positioned on an opposite side to the second metal oxide film, and an area of the first surface is substantially equal to an area of the second surface.

14. The nonvolatile memory device according to claim 9, wherein the second metal oxide film includes a first surface positioned on a side of the first metal oxide film and a second surface positioned on an opposite side to the first metal oxide film, and an area of the second surface is greater than an area of the first surface.

15. A nonvolatile memory device, comprising:

a plurality of first lines;

a plurality of second lines intersecting the plurality of first lines; and memory cells connected between the first and second lines at intersection points of the first and second lines, each of the memory cells comprising:

a variable resistor including a first metal oxide film and configured to reversibly change resistance value by energy application; and a diode including a second metal oxide film and connected in series to the variable resistor, a metal/oxygen ratio of the second metal oxide film being lower than a metal/oxygen ratio of the first metal oxide film.

16. The nonvolatile memory device according to claim 15, wherein the diode is connected to one of the first lines via a first electrode and is connected to the variable resistor via a second electrode, the variable resistor is connected to one of the second lines via a third electrode, and an area of the first electrode is greater than an area of the third electrode.

17. The nonvolatile memory device according to claim 16, wherein an area of the second electrode is less than an area of the first electrode and greater than an area of the third electrode.

18. The nonvolatile memory device according to claim 15, wherein the first metal oxide film includes a first surface positioned on a side of the second metal oxide film and a second surface positioned on an opposite side to the second metal oxide film, and an area of the first surface is greater than an area of the second surface.

19. The nonvolatile memory device according to claim 15, wherein the first metal oxide film includes a first surface positioned on a side of the second metal oxide film and a second surface positioned on an opposite side to the second metal oxide film, and an area of the first surface is substantially equal to an area of the second surface.

20. The nonvolatile memory device according to claim 15, wherein the second metal oxide film includes a first surface positioned on a side of the first metal oxide film and a second surface positioned on an opposite side to the first metal oxide film, and an area of the second surface is greater than an area of the first surface.

* * * * *